US007077660B2

(12) United States Patent
McAllister et al.

(10) Patent No.: US 7,077,660 B2
(45) Date of Patent: Jul. 18, 2006

(54) LAND GRID ARRAY STRUCTURES AND METHODS FOR ENGINEERING CHANGE

(75) Inventors: Michael F. McAllister, Clintondale, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/775,922

(22) Filed: Feb. 10, 2004

(65) Prior Publication Data

US 2004/0159915 A1 Aug. 19, 2004

Related U.S. Application Data

(62) Division of application No. 10/202,726, filed on Jul. 25, 2002.

(51) Int. Cl.
*H01R 12/00* (2006.01)
(52) U.S. Cl. .......................................... 439/66; 439/70
(58) Field of Classification Search ................ 439/66, 439/67, 70; 361/799, 780
See application file for complete search history.

(56) References Cited

U.S. PATENT DOCUMENTS

| 4,549,200 A | 10/1985 | Ecker et al. ................... 357/80 |
| 4,652,974 A | 3/1987 | Ryan ........................... 361/395 |
| 4,803,595 A | 2/1989 | Kraus et al. ................. 361/412 |
| 4,819,131 A * | 4/1989 | Watari ......................... 361/794 |
| 5,060,116 A | 10/1991 | Grobman et al. ........... 361/474 |
| 5,177,594 A * | 1/1993 | Chance et al. .............. 257/678 |
| 5,243,140 A | 9/1993 | Bhatia et al. ............... 174/254 |
| 5,480,309 A * | 1/1996 | Arisaka ......................... 439/43 |
| 5,659,953 A * | 8/1997 | Crane et al. .................. 29/843 |
| 5,691,041 A * | 11/1997 | Frankeny et al. ........... 428/209 |
| 6,239,485 B1 * | 5/2001 | Peters et al. ................ 257/700 |
| 6,388,207 B1 * | 5/2002 | Figueroa et al. ............ 174/262 |
| 6,428,327 B1 * | 8/2002 | Tamarkin et al. ............. 439/67 |
| 6,471,525 B1 * | 10/2002 | Fan et al. ...................... 439/70 |
| 6,521,842 B1 * | 2/2003 | Brinthaupt et al. ......... 174/252 |
| 6,794,581 B1 * | 9/2004 | Smith et al. ................ 174/260 |
| 6,847,529 B1 * | 1/2005 | Dibene et al. .............. 361/803 |

* cited by examiner

*Primary Examiner*—Gary F. Paumen
*Assistant Examiner*—Larisa Tsukerman
(74) *Attorney, Agent, or Firm*—Lynn L. Augspurger

(57) ABSTRACT

A Land Grid Array structure is enhanced with a flex film interposer that not only provides a Land Grid Array (LGA) electrical connection between a Multi-Chip Module (MCM) and the next level of integration such as a system board, but also provides a reliable means to implement desired Engineering Change (EC) capability as well as a means for decoupling power to ground structure to minimize switching activity effects on the System. The invention as described can be implemented for EC repair, for Capacitive Decoupling or both.

1 Claim, 7 Drawing Sheets

LAND GRID ARRAY STRUCTURES AND METHODS FOR ENGINEERING CHANGE

This application is a divisional application of U.S. Ser. No. 10/202,726 filed Jul. 25, 2002, entitled "Land Grid Array Structures and Methods for Engineering Change" which is commonly owned and assigned to International Business Machines Corporation, the contents of which are incorporated in their entirety by reference thereto.

FIELD OF THE INVENTION

This invention relates to Land Grid Array (LGA) compression connectors, and particularly to a method using LGA connectors for executing engineering changes (EC wiring) to both repair and/or implement functional changes to System boards with improvments in the LGA structure.

TRADEMARKS

IBM ® is a registered trademark of International Business Machines Corporation, Armonk, N.Y., U.S.A. Other names may be registered trademarks or product names of International Business Machines Corporation or other companies.

BACKGROUND

Before our invention a Land Grid Array structure has been made in the form of Land Grid Array (LGA) compression connectors by developed by Tyco ® (Tyco electronics is a division of Tyco International Ltd) and Cinch ® (Cinch Connectors, Inc. , a part of Snecma, France), and we have found engineering changes have proved difficult with these devices.

We found that as higher density connectors are implemented on Systems, there is a need for interconnect schemes that permit significant I/O densities while at the same time providing an excellent signal integrity interconnection to the next level of packaging. With the advent of the Land Grid Array (LGA) structures using compression connectors as developed by Tyco, Cinch and others, the density and signal integrity problems have been addressed. However, this structure has caused a new problem to surface. Specifically, there is a need for a suitable method for executing engineering changes (EC wiring) to both repair and/or implement functional changes to System boards. In the early stages of hardware build, there are times that engineering changes are needed for the System boards. These modifications are due to a number of reasons, including architecture changes, additional functional requirements, or early user availability of imperfect hardware.

SUMMARY OF THE INVENTION

A Land Grid Array structure is enhanced with a flex film interposer that not only provides a Land Grid Array (LGA) electrical connection using Plated Through Holes in the flex film between a Multi-Chip Module (MCM) and the next level of integration such as a system board, but also provides a reliable means to implement desired Engineering Change (EC) capability as well as a means for decoupling power to ground structure to minimize switching activity effects on the System. In accordance with an embodiment of the invention for EC repair an insulating plug is applied to remove an original board net and to prevents contact to an I/O pad which in turn was connected to the original board net. The The invention as described can be implemented for EC repair and for Capacitive Decoupling.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

The invention provides a flex film interposer that not only provides a Land Grid Array (LGA) electrical connection between a Multi-Chip Module (MCM) (or similar integrated circuit type structure) and the next level of integration such as a system board, but also provides a reliable means to implement Engineering Change (EC) capability as well as a means for decoupling power to ground structure to minimize switching activity effects on the System. The invention as described can be implemented for EC repair, for Capacitive Decoupling or both. Hence, the overall value of the invention is highly enhance by this flexibility of concept application.

The LGA structure with the compression connector scheme requires an electrically insulated backing structure to counter balance the forces used to compress the chip carrier to the System board. In a typical application, this arrangement requires an insulating sheet/plate and a metallic stiffening plate. By nature of the earlier designs, the assembly prevented the access to the connector area on the board and hence prevented access to the I/O's of the chip carrier. In most applications, this was permissible. However, when engineering changes are needed to the DC and high frequency connections, the ability to maintain excellent electrical measurement characteristics is compromised and thus our new method to accommodate EC changes is required. In addition, as the trend continues to drive the packaging of circuits in higher densities and smaller areas, there is a growing need to provide large amounts of power supply capacitive decoupling as close to the chip carrier as possible.

Our Solutions

1) Both EC Repair & Capacitive Decoupling

Figure 1:
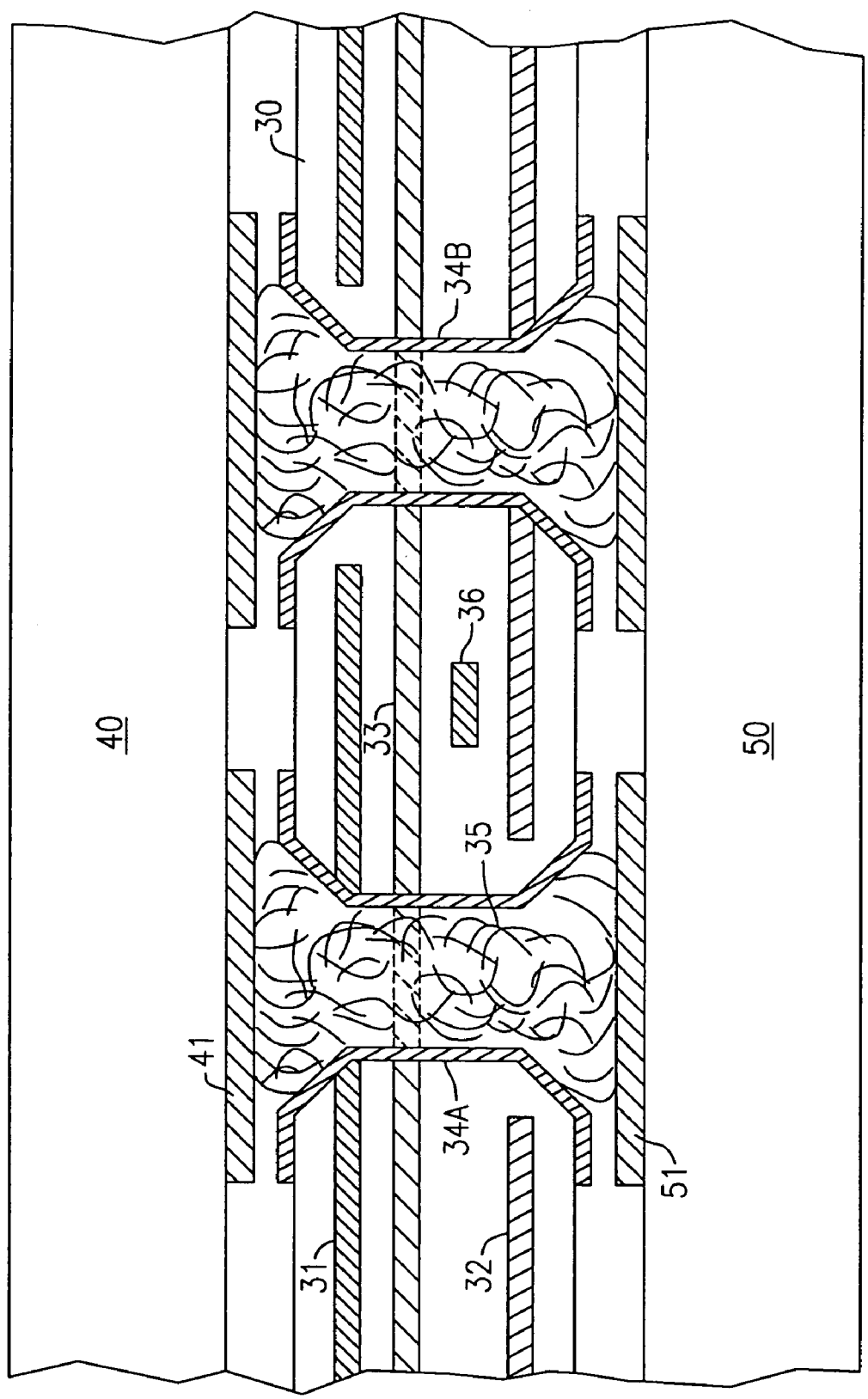
FIG. 1 illustrates a Land Grid Array (LGA) structure using a multi-layer flex film structure (30) composed of two conductive reference planes (31,32), two signal layers (36, 33), and a plurality of our provided Plated Through Holes (herein PTH) that are located between the Multi-Chip Module MCM (40) (or similar type chip carrier) and the System board (50) of the Land Grid Array (LGA) structure.
Figure 2:
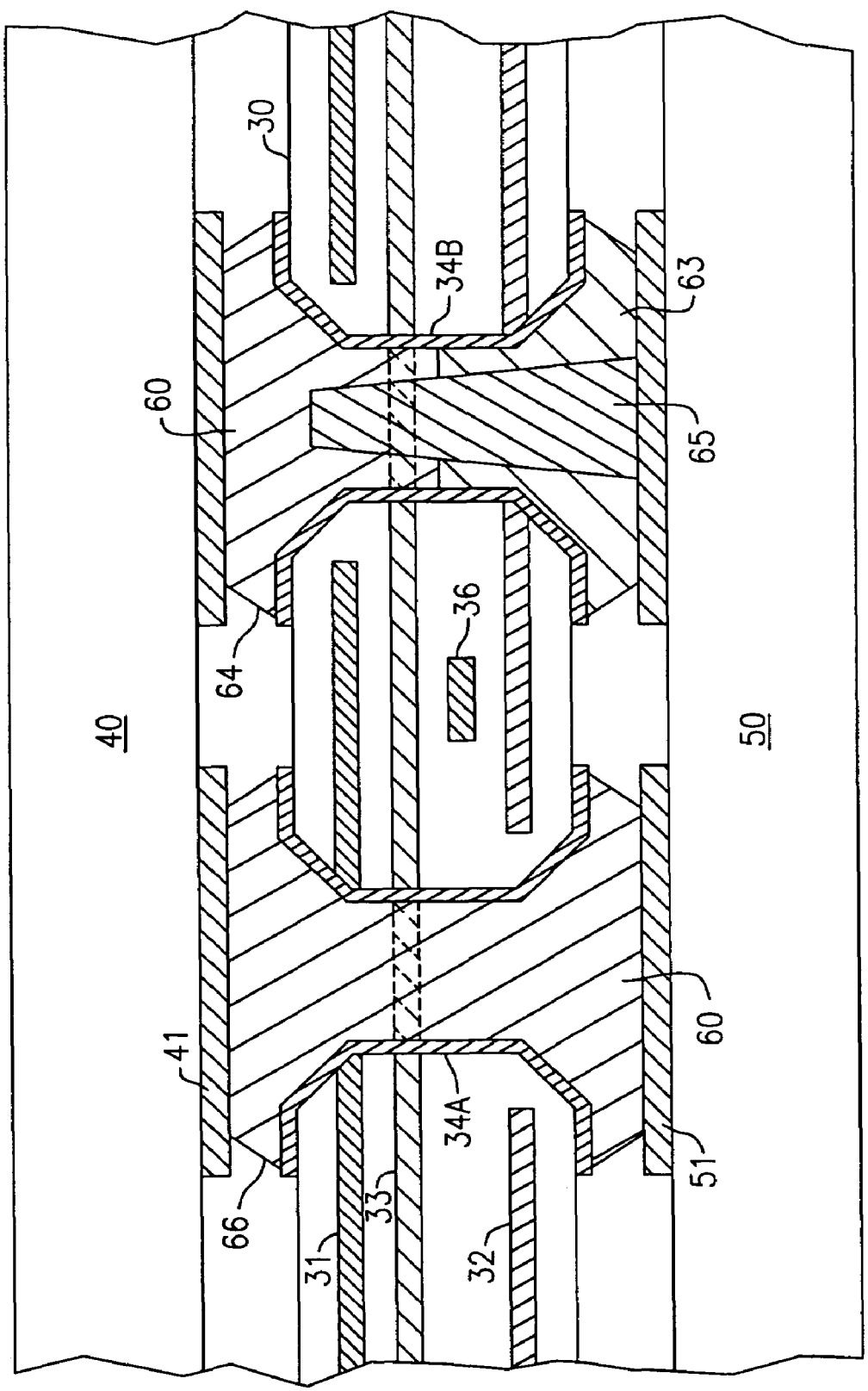
FIG. 2 details the improved structure for an LGA interposer and also shows a new alternative to the injection method for the electrical connection.

As shown in FIG. 1, a multi-layer flex film structure (30) is composed of two reference planes (31,32), two signal layers (36,33), and a plurality of our provided Plated Through Holes (herein PTH) (PTHs are generally 34 and shown in the sections illustrated at 34A, 34B) that are located between the Multi-Chip Module MCM (40) (or similar type chip carrier) and the System board (50). For the Cinch connection scheme, a fuzz button (35) is inserted in the PTH (34A), thus providing the electrical connection between the MCM (40) and the System board (50) via the contacting pads (41) and (51). For PTHs that are connected to power or ground locations on the System board (50) and MCM (40), the corresponding power or ground plane within the flex film is connected to the respected PTH. In the example shown in FIG. 1, reference plane (31) is connected to PTH (34A) and reference plane (32) is connected to PTH (34B). In addition, the use of plated through holes (34A, 34B) in the flex carrier (30), allows for more areas of electrical contacts within and to the fuzz button (35) structure from the MCM (40) to the system board (50) side of the interposer. The use of PTHs in the flex film carrier will reduce the overall resistance of the connections as well as increase their overall reliability. FIG. 2 details the improved structure of the Tyco LGA interposer on the left side of the FIG. 2 and our improvement in accordance with our preferred embodiment, this design, on the right side of FIG. 2. Normally, the electrical connection is provided by an injected connecting conductor (60) made from conductive polymer (e.g., sliver impregnated silicone) that is injected into a PTH (34A). FIG. 2 also shows a new alternative to the injection method for the electrical connection. In this case, the connector (60) is composed of two polymer halves (63, 64) that are riveted together into the PTH (34B) by a polymer or other suitable material rivet expansion pin (65). In an example of our preferred embodiment, this rivet expansion pin (65) is an integral part of the base part (63) half of the polymer conductor (60). Again, the use of plated through holes (34A, 34B), reduces the resistivity of the electrical connection as well increases its overall reliability. In addition, the riveting technique will also provide a means for simplified modifications of a signal connection when used with the proposed EC application. In both FIG. 1 and 2, a capacitive structure is formed between the conductive reference planes (31) and (32). The reference plane (31) is connected to PTH (34A) and reference plane (32) is connected to PTH (34B). This provides for a highly decoupled power distribution structure under the MCM (40).

2) Capacitive Decoupling Only

Figure 7:
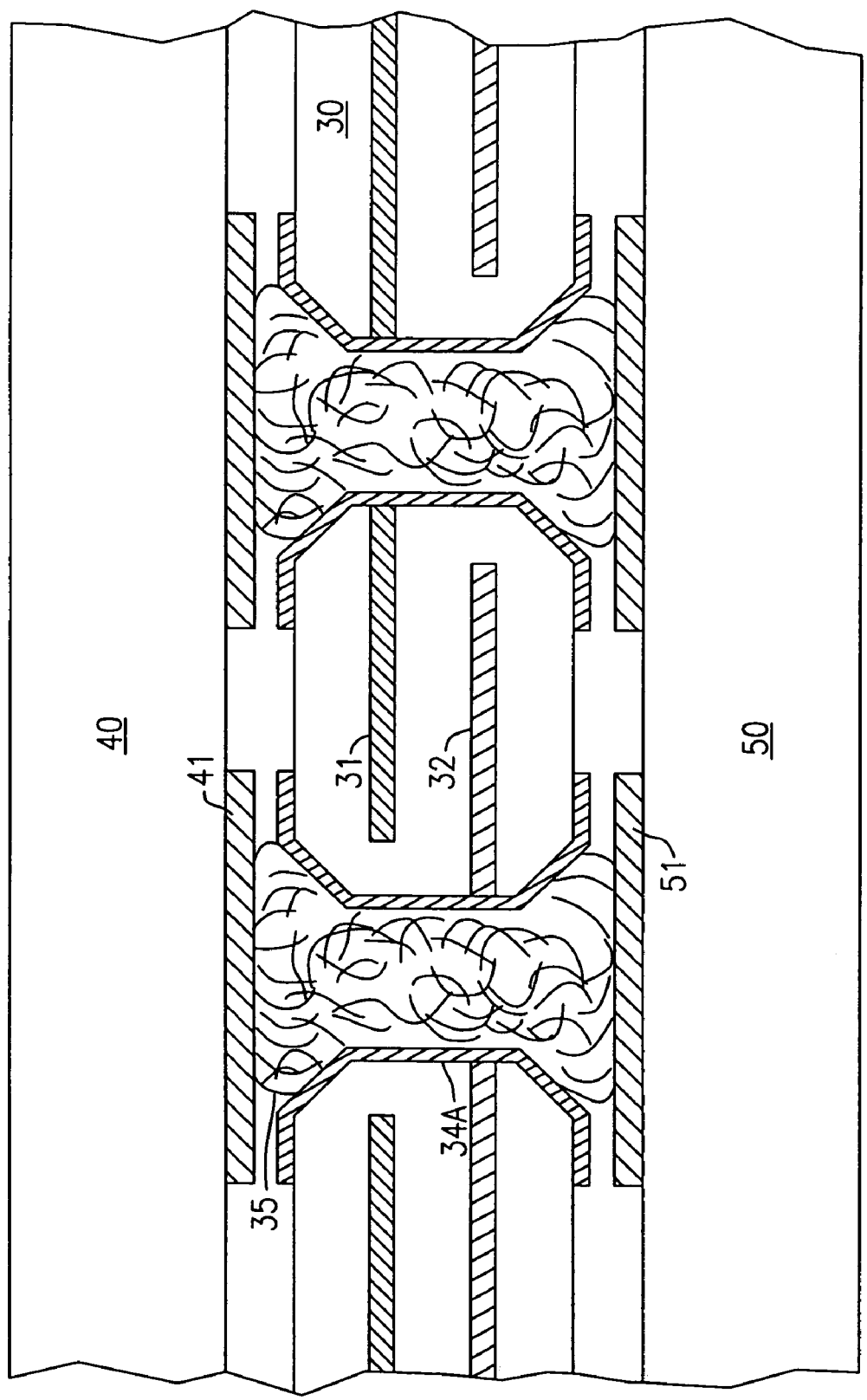
FIG. 7 illustrates our method for providing decoupling of the power supplies.

A simpler method for providing decoupling of the power supplies can be accomplished by the example illustrated in FIG. 7. In this example, the Flex Film (30) contains two or more conductive reference planes connected using a structure described for the Cinch type connector scheme. In this case, the reference plane (31) is connected to the PTH (34A) and likewise the reference plane (32) is connected to another PTH (34A). By doing so, a highly decoupled power supply structure is formed within the flex film carrier.

Another application of that application described in FIG. 1 would be to interchange the reference and signal planes within the flex film carrier and reducing the dielectric thickness between the reference planes. In addition, the dielectric constant of only the insulator between the conductive reference planes could be increased as high as necessary. By doing this, the capacitive decoupling between the reference planes is increased higher then that for the case illustrated in FIG. 1. The advantage for doing would be seen when the requirement for decoupling of the supplies exceeds the requirements for the signal integrity, the parameters of the EC repair and that the higher dielectric constant did not adversely impact the signal integrity of the nets that passed through the flex film.

3) EC Repair Only

Figure 3:
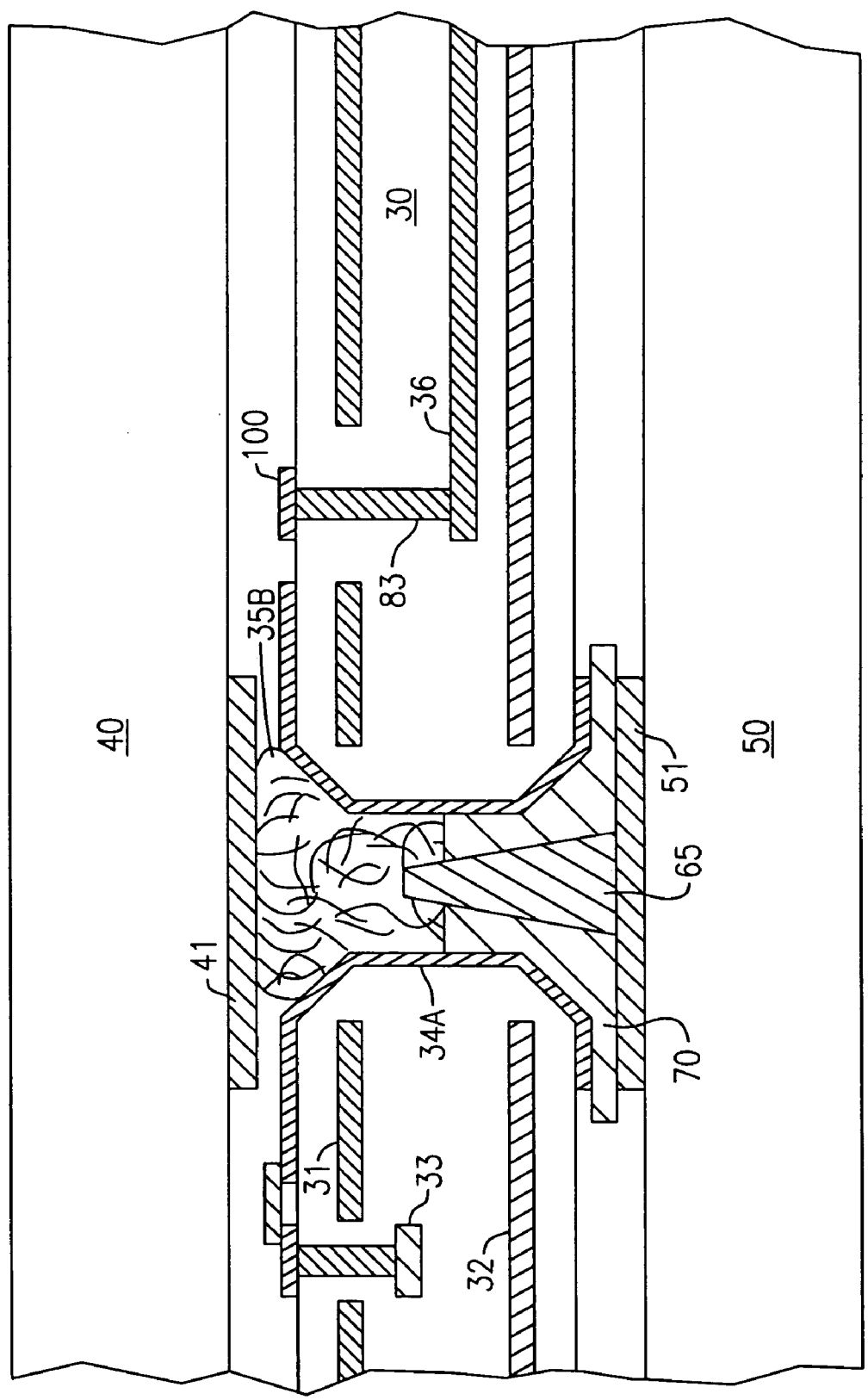
FIG. 3 illustrates the embodiment for preferred EC (Engineering Change) repair structure for a Cinch connection scheme where repair is initiated by the removal of an original fuzz button (35) and the installation of an insulated polymer plug into the PTH (34A) from the System board (50).

The formation of the EC repair structure for the Cinch connection scheme is shown in FIG. 3. Repair is initiated by the removal of the original fuzz button (35) and the installation of an insulated polymer plug into the PTH (34A) from the System board (50) side of the carrier. This plug is composed of two parts, the first being the plug body (70) and the second being the expansion pin (65). The expansion pin (65) helps to secure the insulating plug (70) into the PTH (34A). The thickness of the plug body (70) where it contacts the pad (51) is adjusted to be compatible with the normal separation between the carrier (30) and the system board (50). This insulator plug will then remove all conflicts of the system board net with the EC repair. Next, a replacement fuzz button (35B), which is smaller than the original button (35), is inserted into the PTH (34A). Completion of the EC is accomplished by using a small metal jumper (80) between the top surface metal of the PTH (34A) and the corresponding terminal pad (100) of the X (33) and Y (36) wires that are within the flex film carrier (30).

Figure 4:
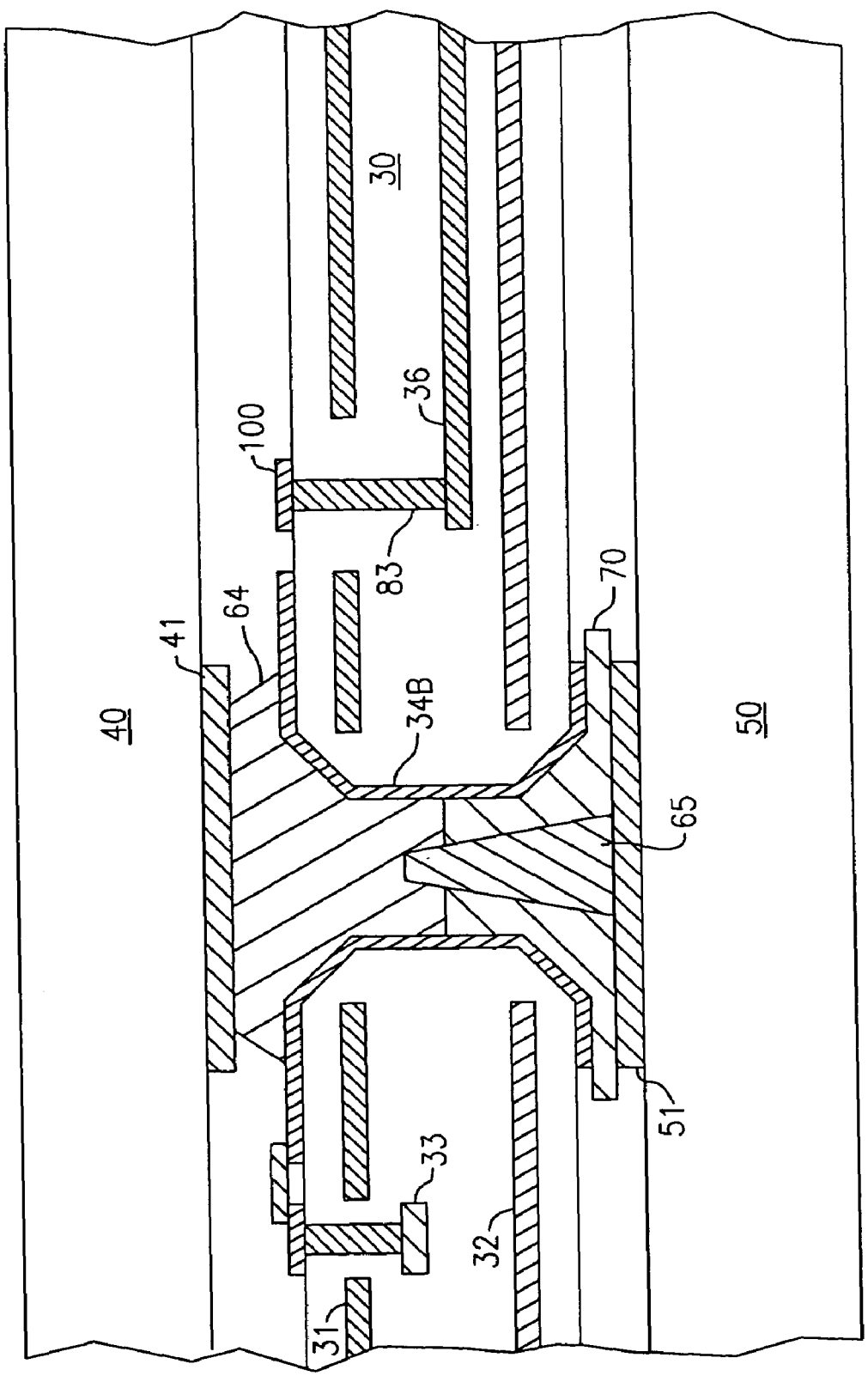
FIG. 4 illustrates EC repair structure for an improved representative Tyco LGA connector structure.

The method for EC repair structure for a representative Tyco structure is shown in FIG. 4. Repair is initiated by the removal of the original polymer structure (60). This is accomplished in one of two methods. If the polymer structure was formed by injection, the signal contact is removed by cutting the crown (66) off and pushing the remaining structure out of the PTH (34B). If the structure was formed by the method of a rivet, then the rivet expansion pin (65) is removed and the conductive segment (63) is removed. Then an insulated polymer plug (70) is inserted into the PTH (34B) from the system board (50) side of the carrier and a replacement cap (64) is inserted and held with a pin (65). Completion of the EC is accomplished by using a small metal jumper (80) between the top surface metal of the PTH (34A) and the corresponding terminal pad (100) of the X (33) and Y (36) wires within the flex film carrier (30).

Figure 5:
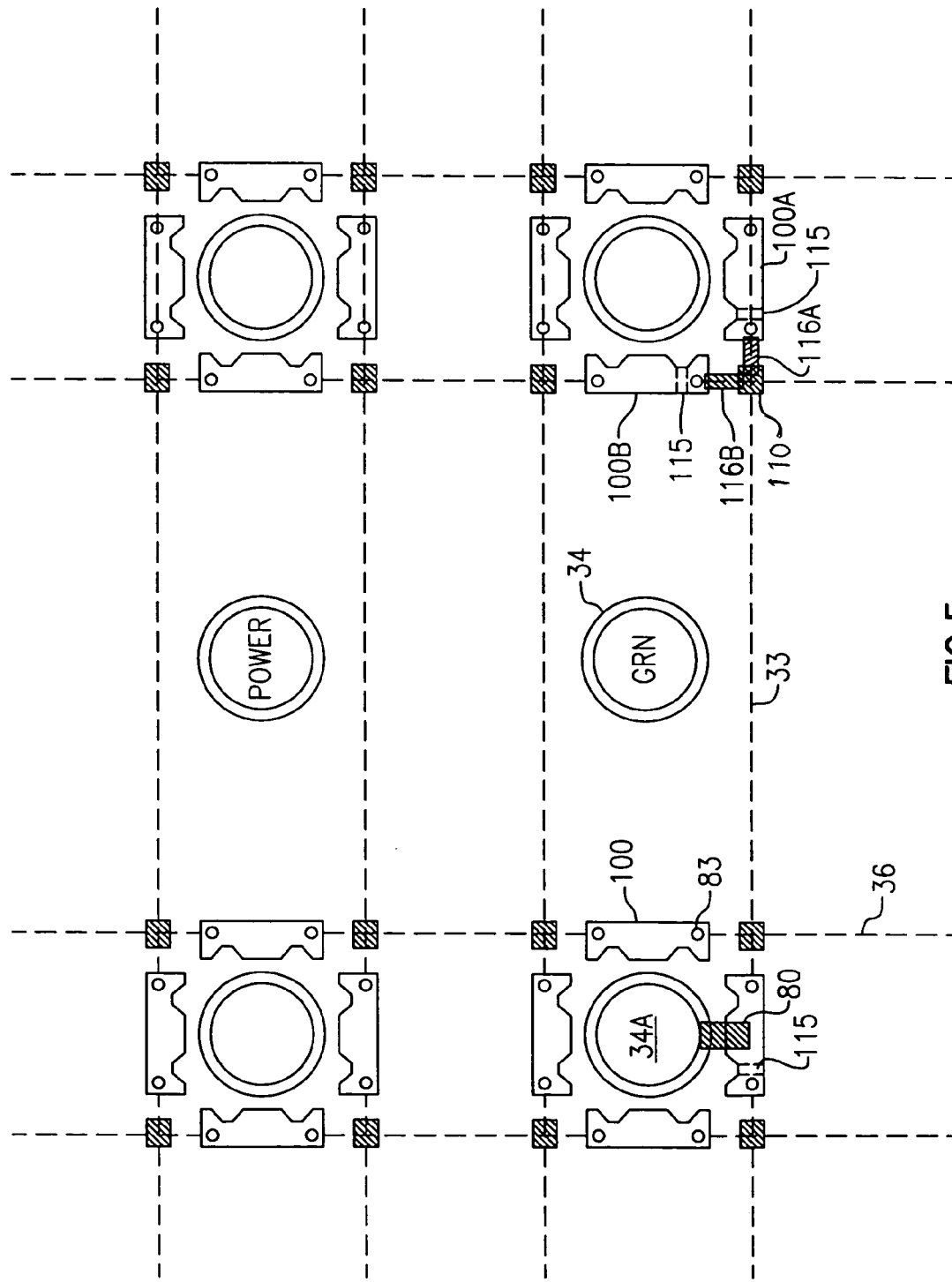
FIG. 5 further illustrates the EC structure repair.

A further explanation of the method for creating a EC structure can be seen in FIG. 5 and the following text. A signal at location (34A) is removed from the system board net by one of the proceeding methods. To further the repair, a top surface structure is formed around each signal location. Four terminal patterns (100) are placed on the sides of the signal PTH (34A) and are connected to the imbedded X (33) and Y (36) signal repair wires through the Vias (83). In addition, a turnabout pad (110) is placed in the corner area formed by the X and Y placement of the terminal land pattern (100). A metal jumper (80) is formed either by plating, screening, sputtering, or by discrete wire. A deletion on the land pad (100) is made at the notched location (115). The deletion at this point can be made by mechanical removal of the notch area or by laser cutting. This removes the unwanted imbedded X or Y wire from the repair. To change directions within the repair, jumpers (116A, 116B) are used to connect the terminal land pattern (100A, 100B) to the turnabout pad (110). Thus by using the X and Y wires with turnabout pads, repairs can be wired out in any direction of a high density array of connections to awaiting spare nets outside of the MCM placement.

Figure 6:
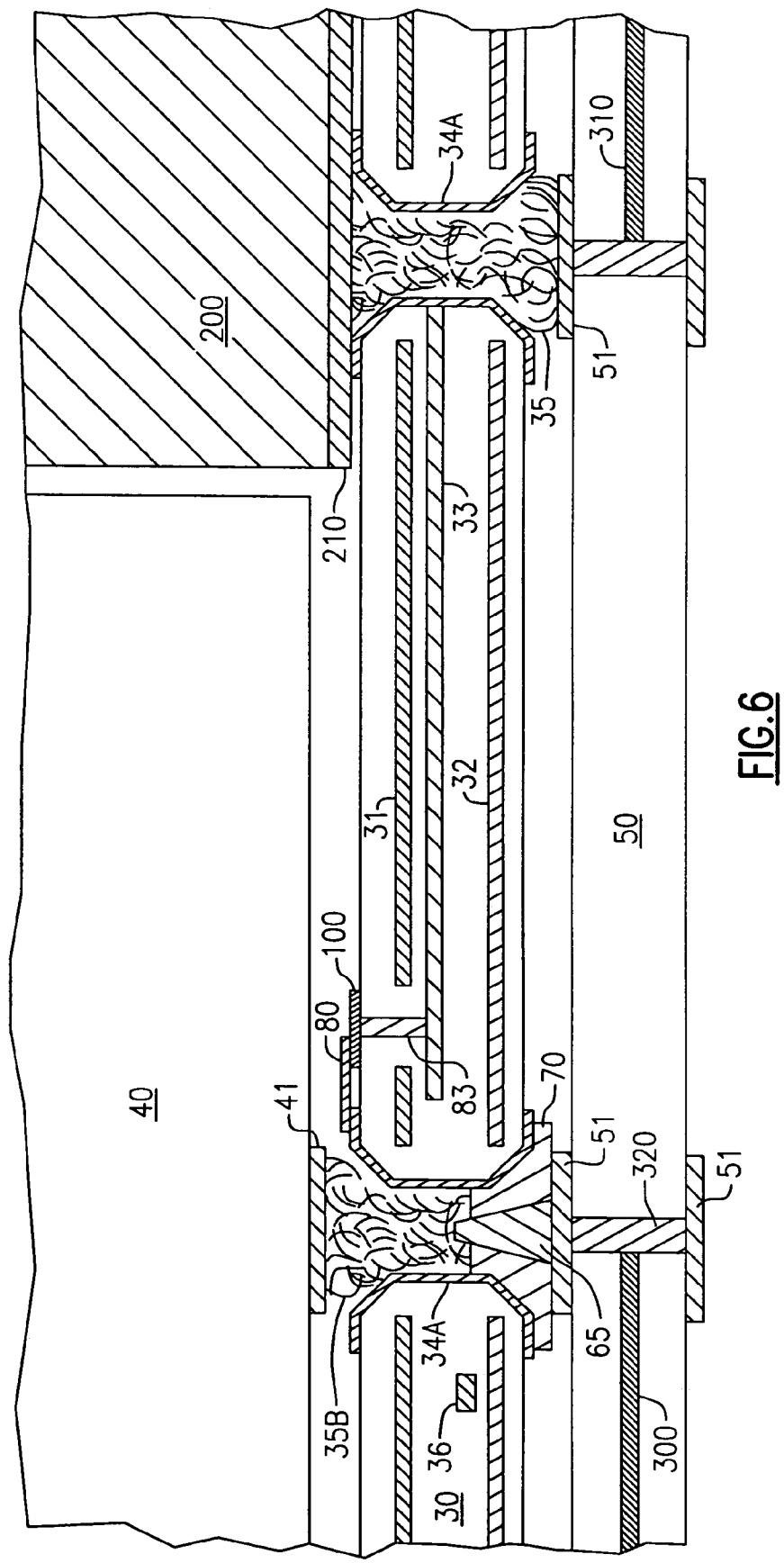
FIG. 6 shows a cross sectional view of a completed EC repair to a spare system board net for a Cinch connection scheme.

A cross sectional view of a completed EC repair to a spare system board net is shown in FIG. 6. It can be seen that the Cinch EC repair is applied to remove the original board net (300), although the EC repair could be applied to a structure made with the Tyco approach previously described. The insulating plug (70) prevents contact to the I/O pad (51) which in turn was connected to the board net (300) by a via (320). The net's path is now from the PTH (34A) through the connection strap (80) to the top surface land pattern (100). Continuing from this pad (100) through to the via (83) to the imbedded wire X wire (33) which is then connected to another PTH (34A). This PTH is located outside of the MCM (40) area and is under part of the MCM retaining fixture (200). To prevent shorting of the fuzz ball (35) to the retaining structure an insulator (210) is installed between the flex film carrier (30) and the retaining fixture (200). Completion of the repair or EC is made by connection to the spare net (310) by the fuzz button (35) by compressing the stiffiner retaining structure (200) to finish the net.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. Land Grid Array structure comprising,
    a flex film interposer for providing a Land Grid Array (LGA) electrical connection disposed between a Multi-Chip Module (MCM) and the next level of integration of a Land Grid Array system and said flex film, wherein said interposer also provides means integral to said flex film interposer for implementing a desired Engineering Change (EC) and said flex film interposer also intergrally provides means for decoupling power to ground in the Land Grid Array structure to minimize switching activity effects on the Land Grid Array system when mounted on a system board wherein the flex film interposer has a plated through hole formed therethrough and there is an insulator plug composed of two parts, a plug body and a fuzz button rivet expansion pin of the plug body inserted in the hole to insulate the plated through hole to prevent electrical contact of the plated through hole with the system board.

* * * * *